(12) United States Patent
Nishikawa

(10) Patent No.: US 6,852,356 B2
(45) Date of Patent: Feb. 8, 2005

(54) EVAPORATION METHOD AND MANUFACTURING METHOD OF DISPLAY DEVICE

(75) Inventor: Ryuji Nishikawa, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 168 days.

(21) Appl. No.: 10/377,115

(22) Filed: Mar. 3, 2003

(65) Prior Publication Data

US 2003/0180474 A1 Sep. 25, 2003

(30) Foreign Application Priority Data

Mar. 1, 2002 (JP) ........................................ 2002-056260

(51) Int. Cl.⁷ ........................... C23C 14/04; B05D 5/06; B05D 5/12; B05D 1/32
(52) U.S. Cl. .............................. 427/64; 427/66; 427/68; 427/69; 427/70; 427/248.1; 427/255.6; 427/282; 118/721
(58) Field of Search .............................. 427/64, 66, 68, 427/69, 70, 282, 248.1, 255.6; 118/720, 721, 504, 505

(56) References Cited

U.S. PATENT DOCUMENTS

| 6,251,472 | B1 | * | 6/2001 | Ohashi ........................ 427/100 |
| 6,280,821 | B1 | * | 8/2001 | Kadunce et al. ............ 428/157 |
| 6,373,135 | B1 | * | 4/2002 | Weber ......................... 257/758 |
| 6,469,439 | B2 | * | 10/2002 | Himeshima et al. ........ 313/506 |
| 2004/0142625 | A1 | * | 7/2004 | Freeman et al. .............. 445/60 |

* cited by examiner

Primary Examiner—Michael Cleveland
(74) Attorney, Agent, or Firm—Morrison & Foerster LLP

(57) ABSTRACT

A glass substrate and a shadow mask are put tightly together by inserting the glass substrate between a magnet and the shadow mask made of magnetic material. A pattern forming of an organic EL device is performed by depositing an organic EL material on the surface of the glass substrate from an evaporation source through an opening portion in the shadow mask. A coarsening processing has been performed on the surface of shadow mask facing the glass substrate. This suppresses the damage on the substrate surface by the shadow mask during the evaporation processing.

14 Claims, 8 Drawing Sheets

EVAPORATION METHOD AND MANUFACTURING METHOD OF DISPLAY DEVICE

BACKGROUND OF THE INVENTION

1. Field of Invention

This invention relates to an evaporation method and a manufacturing method of display device, especially to an evaporation method and an manufacturing method of display device that prevent a mechanical damage to the surface of a substrate, on which a pattern is formed through evaporation.

2. Description of the Related Art

An EL display device with an electroluminescent (referred to as EL hereinafter) element has been gathering attention as a display device substituting a CRT or an LCD. Development efforts for the EL display device with a thin film transistor (referred to as TFT hereinafter) as a switching device for driving the EL device have been made accordingly.

FIG. 8 is a plan view showing the vicinity of a display pixel of an organic EL display device. FIG. 9A shows a cross-sectional view of the device along the A—A cross-sectional line, and FIG. 9B shows a cross-sectional view of the device along the B—B cross-sectional line in FIG. 8.

As seen from FIGS. 8, 9A, and 9B, the display pixel 115 is formed in an area surrounded with a gate signal line 51 and a drain signal line 52. The display pixels are disposed as a matrix configuration.

An organic EL device 60, which is a light-emitting device, a switching TFT 30 for controlling the timing of supplying electric current to the organic EL device 60, a driving TFT 40 for supplying electric current to the organic EL device 60, and a storage capacitance element are disposed in the display pixel 115. The organic EL device 60 includes an emissive layer consisting of an anode 61, which is a first electrode, and a light-emitting material and a cathode 63, which is a second electrode.

The first TFT 30, which is the switching TFT, is disposed near the crossing of the signal lines 51, 52. A source 33s of the TFT 30 functions also as a capacitance electrode 55 that forms capacitance with a storage capacitance electrode line 54, and is connected to a gate 41 of the second TFT 40, which is an EL device driving TFT. A source 43s of the second TFT is connected to the anode 61 of the organic EL device 60 and a drain 43d is connected to a diving source line 53 that is the source of the electricity supplied to the organic EL device 60.

The storage capacitance electrode line 54 is disposed in parallel with the gate signal line 51. The storage capacitance electrode line 54 is made of chrome and forms capacitance by accumulating electric charge with the capacitance electrode 55 connected to the source 33s of the TFT through a gate insulating film 12. A storage capacitance element 56 is disposed to store the voltage applied to a gate electrode 41 of the second TFT 40.

The TFTs 30,40 and the organic EL device are sequentially disposed on a substrate 10, which may be a glass substrate, a resin substrate, a conductive substrate or a semiconductor substrate, as shown FIGS. 9A and 9B. When the conductive substrate or the semiconductor substrate is used as the substrate 10, an insulating film made of $SiO_2$ or SiN should be disposed on the substrate first. Then the first and second TFTs and the organic EL device are formed.

Both TFTs 30,40 should have a top-gate configuration, where the gate electrode is located above an active layer with the gate insulating film between them.

The explanation on the first TFT 30, the switching TFT will be made hereinafter.

As shown in FIG. 9A, an amorphous silicon film (referred to as a-Si film hereinafter) is formed through a CVD method on the insulating substrate 10, which is made of a quartz glass or a non-alkaline glass. The laser beam is shed on the a-Si film for re-crystallization from melt, forming a poly-crystalline silicon film (referred to as a p-Si film, hereinafter). This functions as the active layer 33. Single layer or multiple layers of $SiO_2$ film and SiN film is formed on the p-Si film as the insulating film 12, on which the gate signal line 51 also working as the gate electrode 31 made of a metal with a high-melting point such as Cr, Mo and the drain signal line 52 made of Al are disposed. The driving source line 53 made of Al that is the source of the driving power of the organic EL device is also disposed.

A $SiO_2$ film, a SiN film and a $SiO_2$ film are sequentially disposed to form an interlayer insulating film 15 on the entire surface of the gate insulating film 32 and the active layer 33. A drain electrode 36, which is formed by filling a contact hole formed corresponding to the drain 33d with a metal such as Al, is disposed, and a flattening insulating film 17 made of organic resin for flattening the surface is formed on the entire surface.

Next, the description on the second TFT 40, which is the TFT for driving the organic EL device, will be provided. As shown in FIG. 9B, an active layer 43, which is formed by illuminating the laser beam for poly-crystallization, a gate insulating film 12, and a gate electrode 41 made of a metal with a high-melting point such as Cr, Mo are sequentially disposed on the insulating substrate 10, which is made of a quartz glass or a non-alkaline glass. A channel 43c, and a source 43s and a drain 43d located both sides of the channel 43c are formed in the active layer 43. A $SiO_2$ film, a SiN film and a $SiO_2$ film are sequentially disposed to form the interlayer insulating film 15 on the entire surface of the gate insulating film 12 and the active layer 43. The driving source line 53, which is connected to the driving source by filling a contact hole formed corresponding to the drain 43d with a metal such as Al, is disposed. Furthermore, the flattening insulating film 17 made of organic resin for flattening the surface is formed on the entire surface. A contact hole corresponding to the location of the source 43s is formed in the flattening film 17. A transparent electrode made of ITO that is the anode 61 of the organic EL device making a contact with the source 43s through the contact hole is formed on the flattening film 17. The anode 61 is formed separately, forming an island for each of the display pixel.

The organic EL device 60 has the configuration, where the anode 61 made of the transparent electrode such as ITO (Indium Tin Oxide), a hole transportation layer 62 including a first hole transportation layer made of MTDATA (4, 4-bis (3-methylphenylphenylamino) biphenyl) and a second hole transportation layer made of TPD (4, 4, 4-tris (3-methylphenylphenylamino) triphenylanine), an emissive layer 63 made of Bebq2 (bis(10-hydroxybenzo[h] quinolinato)beryllium) including quinacridone derivative, an electron transportation layer 64 made of Bebq2, and the cathode 65 made of either magnesium-indium alloy, aluminum, or aluminum alloy are disposed in this order.

In the organic El device 60, a hole injected from the anode 61 and an electron injected from the cathode 65 are recombined in the emissive layer and an exciton is formed by exciting an organic module forming the emissive layer 63. Light is emitted from the emissive layer 63 in a process of relaxation of the exciton and then released outside after going through the transparent anode 61 to the transparent insulating substrate 10, thereby to complete light-emission.

This technology is described in, for example, Japanese Laid-Open Patent Publication No. H 11-283182.

The organic EL material used in the hole transportation layer 62, the emissive layer 63, and the electron transportation layer 64 of the organic EL device 60 has a low anti-solvent property and it is vulnerable to water. Therefore, the photolithographic technology of the semiconductor process can not be utilized. Thus, the hole transportation layer 62, the emissive layer 63, and the electron transportation layer 64 of the organic EL device 60 are formed by evaporation using a shadow mask.

Next, the pattern forming method through evaporation of the organic EL material will be explained by referring to FIGS. 10–13. The reference numeral 100 indicates the vacuum evaporation device, the reference numeral 101 an exhaust system, the reference numeral 110 a supporting table in the chamber of the vacuum evaporation device 100. A shadow mask (an evaporation mask) 111 made of magnetic material such as nickel (Ni) or invar alloy ($Fe_{64},Ni_{36}$) is disposed on the supporting table 110. A plurality of opening portions 112 is formed in the predetermined locations of the shadow mask 111.

A magnet 120, which is movable in vertical direction, is disposed on the shadow mask 111 on the supporting table 110. The reference numeral 130 indicates a glass substrate known as a mother glass between the magnet 120 and the shadow mask 111. The reference numeral 140 denotes a evaporation source located underneath the shadow mask 111 and movable in the horizontal direction along with the shadow mask 111.

Suppose the chamber of the vacuum evaporation device 100 is kept vacuum by the exhaust system 101, in FIG. 10. The glass substrate 130 is inserted between the magnet 120 and the shadow mask 111 by a transportation system not shown in the figure. Then the glass substrate 130 is disposed on the shadow mask 111 by the transportation system as seen from FIG. 11.

Then, the magnet 120 is moved downwards to touch the upper surface of the glass substrate 130 as shown in FIG. 12. The shadow mask 111, receiving magnetic power from the magnet 120, is tightly placed to the lower surface of the glass substrate 130, on which a pattern will be formed.

The evaporation source 140 is moved in the horizontal direction from the left edge to the right edge of the glass substrate 130, as seen from FIG. 13, by a moving system not shown in the figure. During the evaporation source 140 is moving, the organic EL material is evaporated and deposited to the surface of the glass substrate 130 through the opening portion 112 of the shadow mask 111. The evaporation source 140 is a crucible tall in the vertical direction, as shown in FIG. 13. The evaporation material in the crucible is heated by a heater for evaporation.

The magnet 120 moves upwards when the evaporation is finished. The glass substrate 130 is lifted from the shadow mask 111 and moved to the location of the next operation by the transportation system. This completes the pattern forming of the organic EL device 60.

However, the conventional evaporation method described above has a problem of giving a mechanical damage to the pattern forming surface of the glass substrate 130, damaging the organic EL device.

This problem is caused by a friction between the shadow mask 111 and the glass substrate 130, giving a mechanical damage to the surface of the glass substrate 130, when (1) the shadow mask 111 is disposed on the glass substrate 130 by the transportation system, (2) the glass substrate 130 is tightly placed to the shadow mask 111 by the magnet 120, and (3) the shadow mask 111 is lifted from the glass substrate 130.

The size of the glass substrate 130 has been becoming larger in recent years. Therefore, the deformation of the glass substrate 130 becomes bigger during the processes of (1) and (3) described above, and bigger damages result when the deformed area of the glass substrate 130 touches the surface of the shadow mask 111.

SUMMARY OF THE INVENTION

The invention provides an evaporation method that includes providing an evaporation mask that has an opening and comprises a top-side coarsened surface, placing the evaporation mask on a bottom surface of a substrate so that the top-side coarsened surface of the evaporation mask contacts the bottom surface of the substrate, and depositing an evaporation material from an evaporation source on the bottom surface of the substrate through the opening of the evaporation mask.

The invention also provides a manufacturing method of a display device. The method includes providing an evaporation mask that has an opening and comprises a top-side coarsened surface. The evaporation mask is made of a magnetic material. The method also includes placing an insulating substrate between a magnet and the evaporation mask so that the top-side coarsened surface of the evaporation mask faces a bottom surface of the substrate, and allowing the magnet to push the insulating substrate against the evaporation mask. The method further includes depositing an organic electroluminescent material from an evaporation source on the bottom surface of the insulating substrate through the opening of the evaporation mask.

DESCRIPTION OF THE INVENTION

Figure 1:
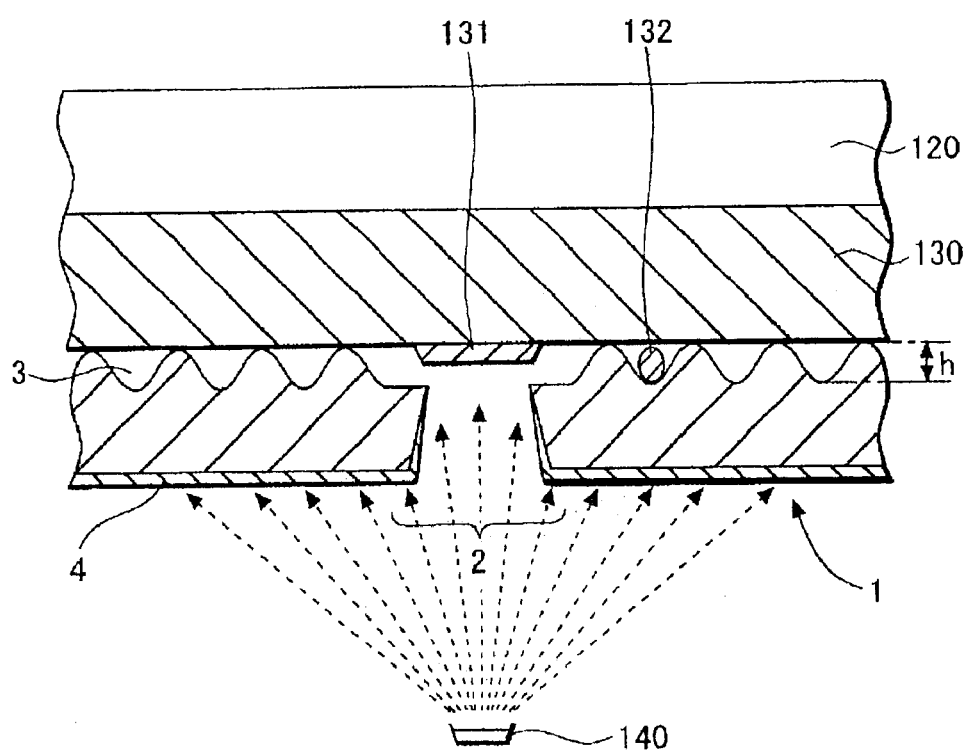
FIG. 1 schematically shows an evaporation method used for manufacturing an organic EL display device of an embodiment of this invention.

An embodiment of this invention will be described by referring to the above figures. FIG. 1 shows an evaporation method for manufacturing an organic EL display device of this embodiment. The same components in FIG. 1 as those in FIGS. 9–13 are given the same reference numerals.

The feature of this embodiment is the configuration of a shadow mask. The steps of this evaporation method are substantially the same as those shown in FIGS. 10–13. FIG. 1 shows the evaporation process corresponding to the process shown in FIG. 13. The shadow mask 1 is tightly placed to a glass substrate 130 by the magnetic power of a magnet 120. With this condition, the evaporation material such as an organic EL material or a material for a cathode 65 (for example, aluminum) is evaporated from an evaporation source 140 and disposed to a pattern forming surface of the glass substrate 130 through an opening portion 2 of the shadow mask 1, forming a pattern 131 of an organic EL device 60.

Figure 9A:
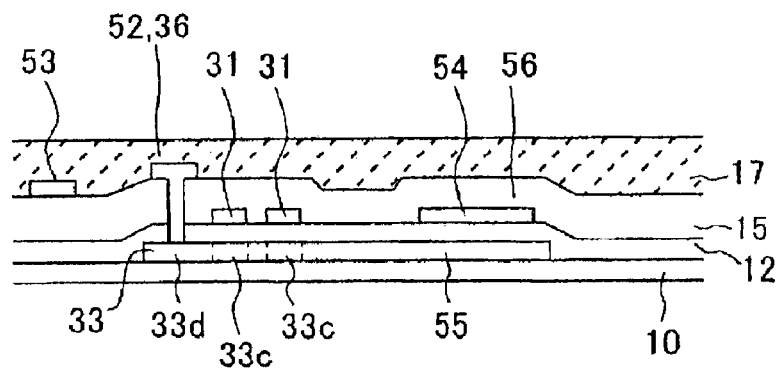
FIGS. 9A and 9B are cross-sectional views along line A—A and line B—B, respectively, in FIG. 8.
Figure 9B:
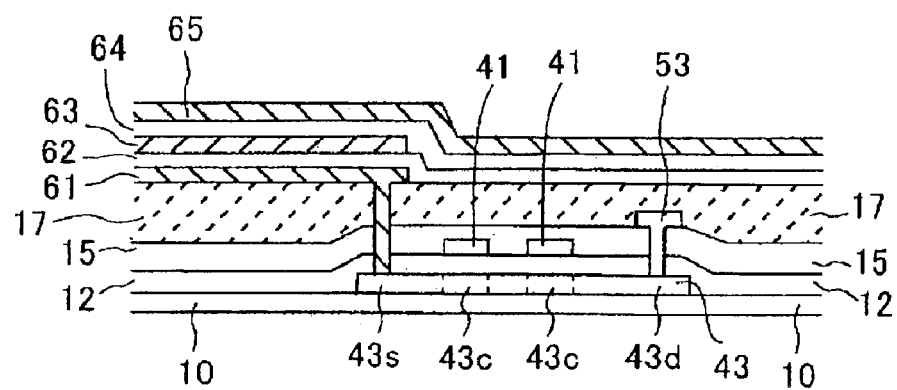
Figure 10:
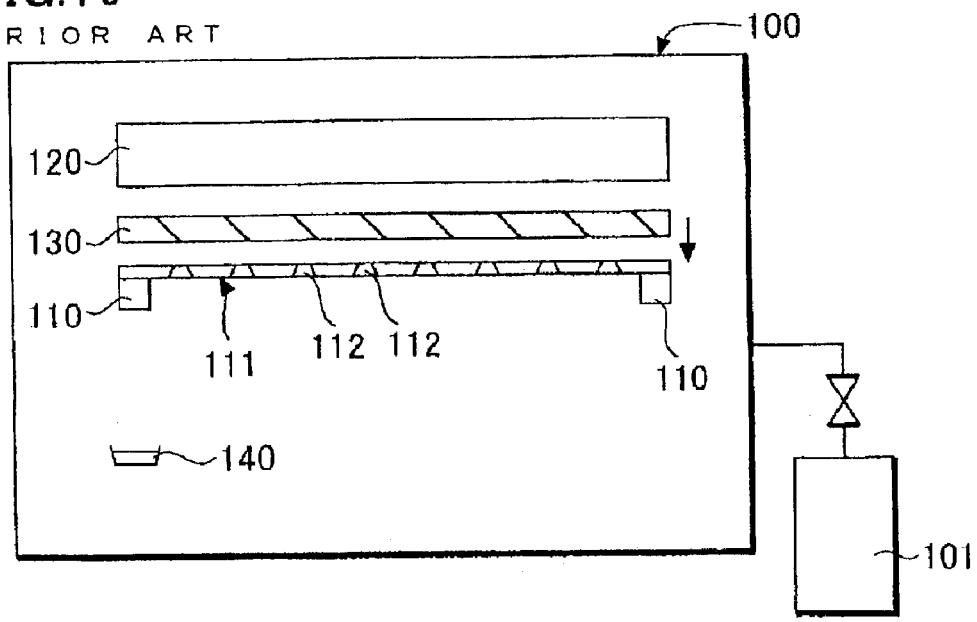
FIGS. 10–13 show steps of a pattern forming by a conventional evaporation method to manufacture an organic EL display.
Figure 11:
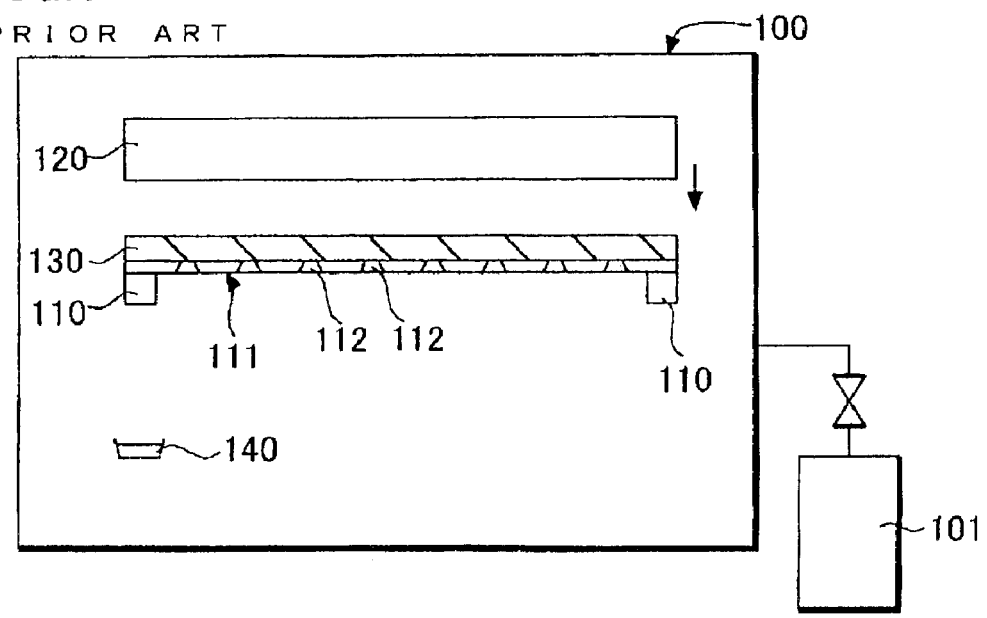
Figure 12:
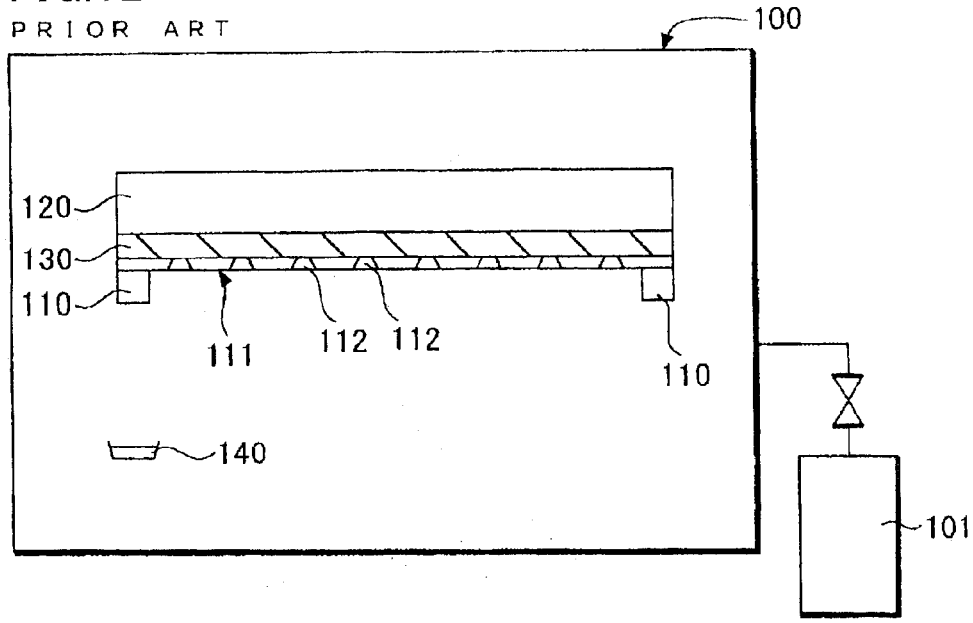
Figure 13:
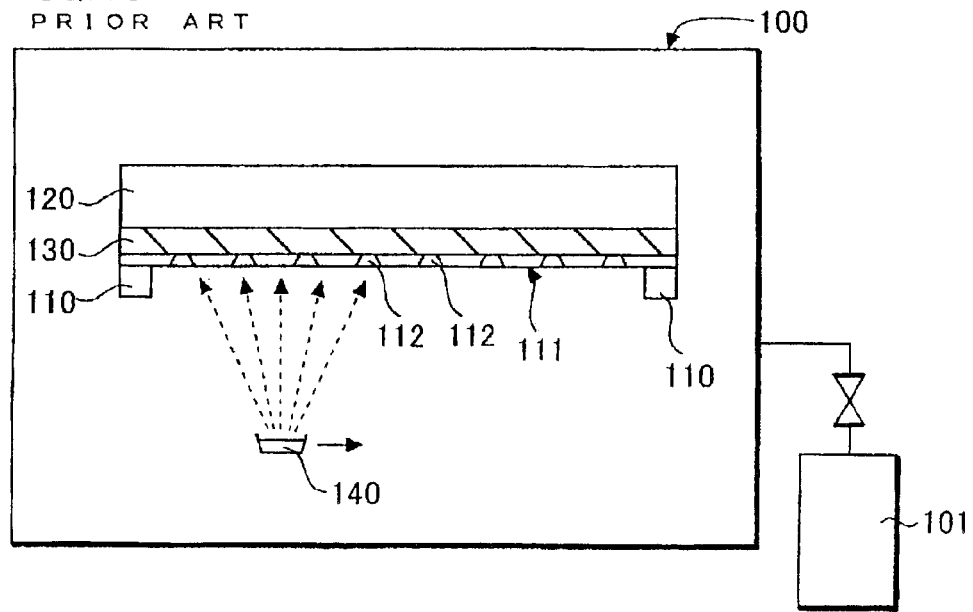

Although they are not shown in the figure, a TFT, an interlayer insulating film 15, a flattening insulating film 17, an anode 61 made of a transparent electrode such as ITO (Indium Tin Oxide) shown in FIGS. 9A and 9B have been formed on the pattern forming surface of the glass substrate 130.

A coarsening processing is performed on a surface 3 of the shadow mask 1 facing the surface of the glass substrate 130 in this embodiment, making convex and concave structures on the surface. The coarsening processing can be performed by a sand blast processing or an etching processing using a mask, which will be explained in detail later.

When the coarsening processing is performed to the shadow mask 1, the area that touches the glass substrate 130 is reduced, compared to the case where the shadow mask has a mirror surface finish. Although the shadow mask 1 touches the glass substrate 130 when (1) the shadow mask 1 is disposed on the glass substrate 130 by the transportation system, (2) the glass substrate 130 is tightly placed to the shadow mask 1 by the magnet 120, and (3) the shadow mask 1 is lifted from the glass substrate 130, the area touching the glass substrate is small, reducing the mechanical damage given to the glass substrate 130.

The shape of the convex structure formed on the shadow mask 1 by the coarsening processing has ideally a round shape, because such a shape disperses the stress given to the top of the convex structure, further protecting the surface of the glass substrate 130 from the damage.

The height difference h between bottom of the concave valley and top of convex peak on the shadow mask 1 treated with the coarsening processing should preferably be between 1 $\mu$m and 10 $\mu$m. The glass substrate 130 can still be placed tightly to the shadow mask 1 in this range of roughness. Therefore, the deterioration of the accuracy in the pattern forming through the evaporation such as the blur of the patterning can be prevented.

Since there are dusts inside the chamber of a vacuum evaporation device 100, the dusts are dragged in between the glass substrate 130 and the conventional shadow mask with a mirror surface finish. The dusts attached to the surface of glass substrate 130 give damages to the glass substrate 130, causing the deterioration of the display device known as dark spot. However, when the shadow mask 1 is treated with the coarsening processing as described in the embodiment, the surface of the shadow mask has concave and convex structures. Therefore, dusts 132 will enter the concave portion of the shadow mask 1, preventing the attachment of the dust to the glass substrate 130 and therefore preventing the damage of the glass substrate 130 by the dusts.

The cross-section of the opening portion 2 of the shadow mask 1 has a tapered shape with the wider end facing the evaporation source 140 because the evaporation material comes flying from the evaporation source 140 in wider range of the directions.

The evaporation material from the evaporation source 140, for example, an organic EL material or a material for the cathode 65 (for example, aluminum) is disposed on the surface of the shadow mask 1 facing the evaporation source 140, forming a evaporation layer 4. The evaporation material reaches to the glass substrate 130 only through the opening portion 2. Otherwise, the flux of the evaporation material is blocked by the shadow mask 1. However, when the surface of the shadow mask 1, to which the evaporation layer 4 is disposed as well, has a mirror surface finish, the evaporation layer 4 will be easily peeled off during the evaporation process.

The peeled-off pieces of the evaporation layer 4 have impurities. A pattern 131 of the organic EL device 60 formed on the glass substrate 130 is contaminated if the peeled-off pieces of the evaporation layer fall into the evaporation source 140 and are evaporated onto the glass substrate again. This will cause the deterioration of the property of the organic EL device 60.

Figure 2:
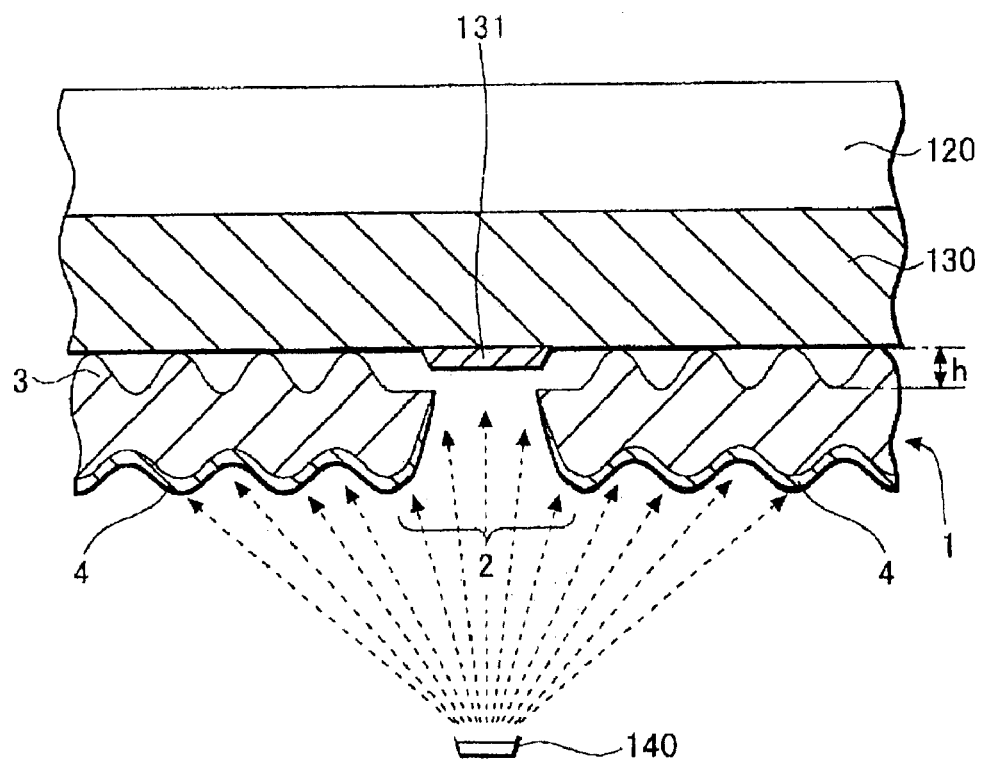
FIG. 2 schematically shows another evaporation method used for manufacturing an organic EL display device of the embodiment of this invention.

It is preferable to perform the coarsening processing to the surface of the shadow mask 1 that faces the evaporation source 140 in a similar manner to the other surface of the shadow mask, as shown in FIG. 2. The evaporation layer 4 and the shadow mask 1 make contact at a larger area because the surface area of the shadow mask 1 increases after the coarsening processing. Therefore, the evaporation layer 4 will not peel off easily due to the anchor effect.

Figure 3:
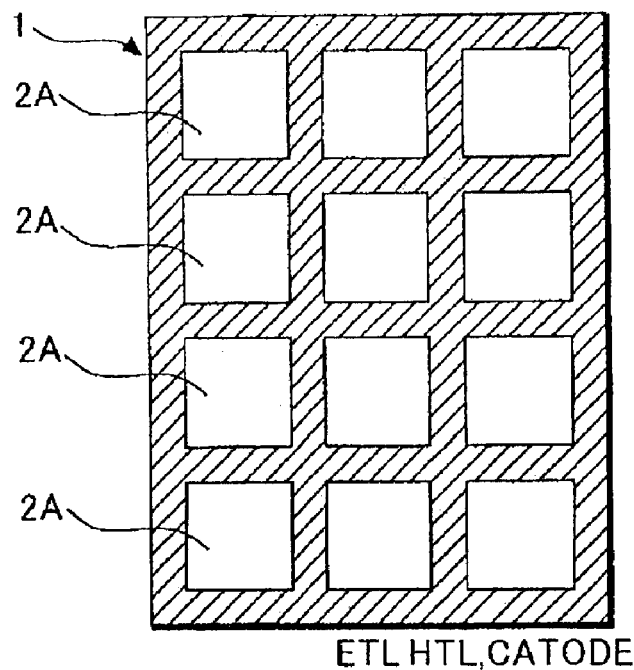
FIG. 3 is a plan view of an example of a shadow mask of the embodiment of this invention.

FIG. 3 is a plan view showing an example of the shadow mask 1 described above. This shadow mask 1 is the mask corresponding to a hole transportation layer 62, an electron transportation layer 64, and the cathode 65, and a plurality of opening portions 2A is formed in the area corresponding to the display area of the organic EL display device. The coarsening processing is performed on the surface (or the other side) of the shadow mask 1 except the opening portion 2A.

Figure 4:
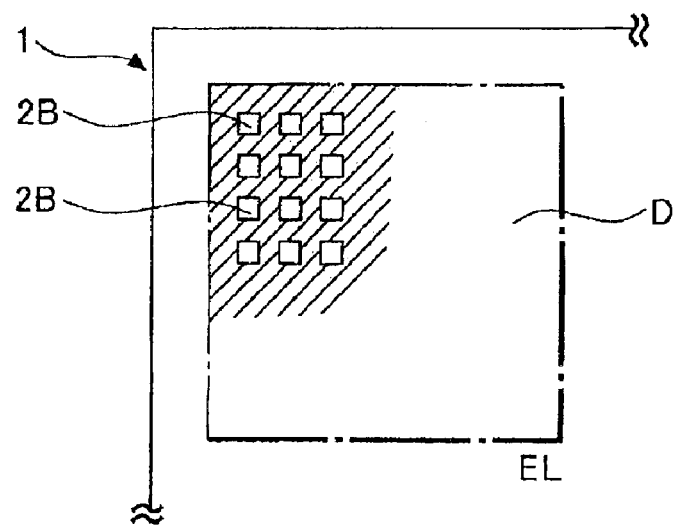
FIG. 4 is a plan view of another example of a shadow mask of the embodiment of this invention.

FIG. 4 is a plan view of another example of the shadow mask 1 described above. This shadow mask 1 is the mask corresponding to the emissive layer 63. A plurality of smaller opening portions 2B is formed for each of the pixels R, G, and B in the area D corresponding to the display area of the organic EL display device. The coarsening processing is performed on the surface (or the other side) of the shadow mask 1 except the opening portion 2B.

Figure 5:
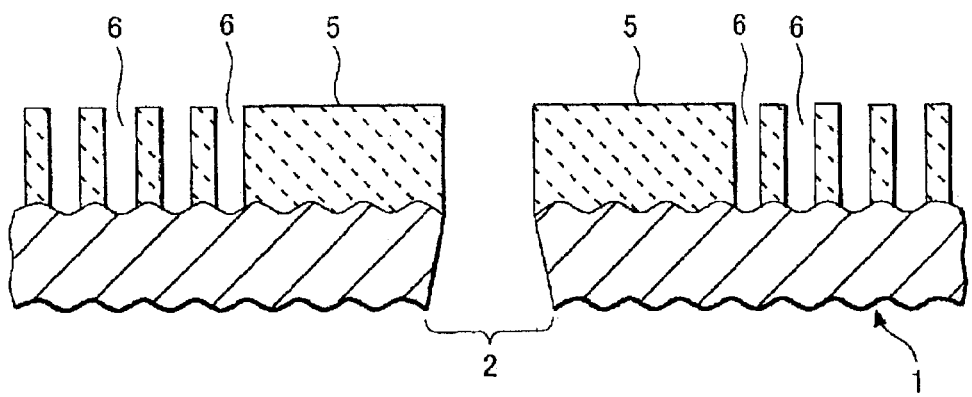
FIGS. 5–7 show steps of a coarsening processing of the shadow mask of the embodiment of this invention.

Next, an example of the coarsening processing of the shadow mask 1 will be described by referring to FIGS. 5–7. A sand blast processing is performed on the base material of the shadow mask made of magnetic material such as nickel (Ni) or invar alloy ($Fe_{64}Ni_{36}$). Then, the opening portion 2 is formed through etching. Although it can be used as a shadow mask 1, a desirable resist pattern 5 is further formed on the surface in this embodiment. The resist pattern 5 has a plurality of opening portions 6 away from the opening portion 3.

Figure 6:
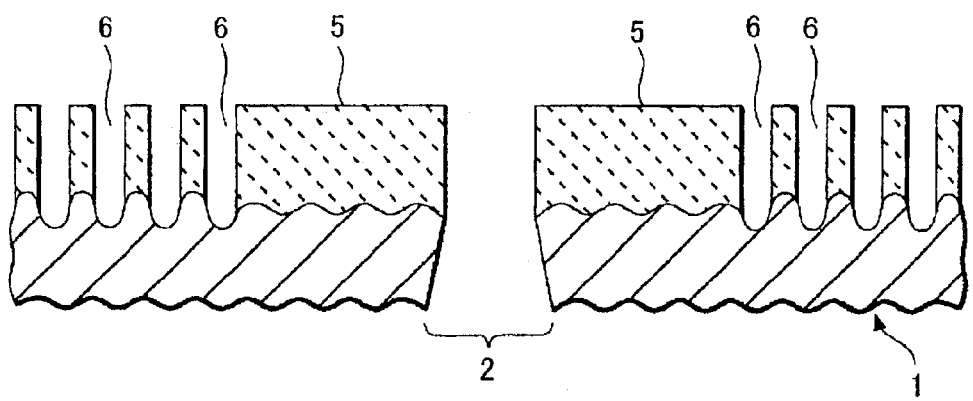
Figure 7:
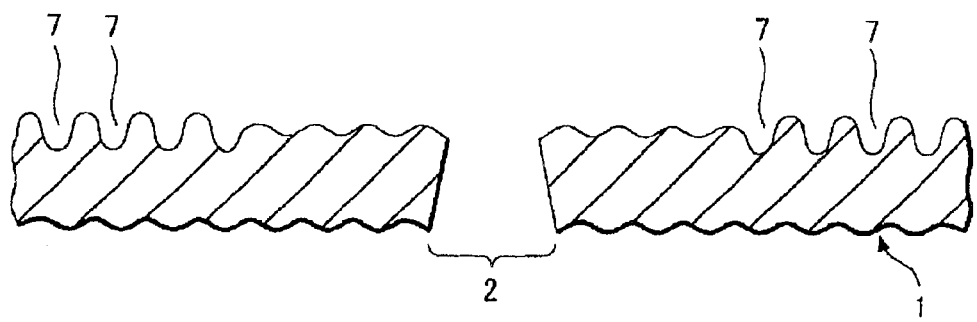
Figure 8:
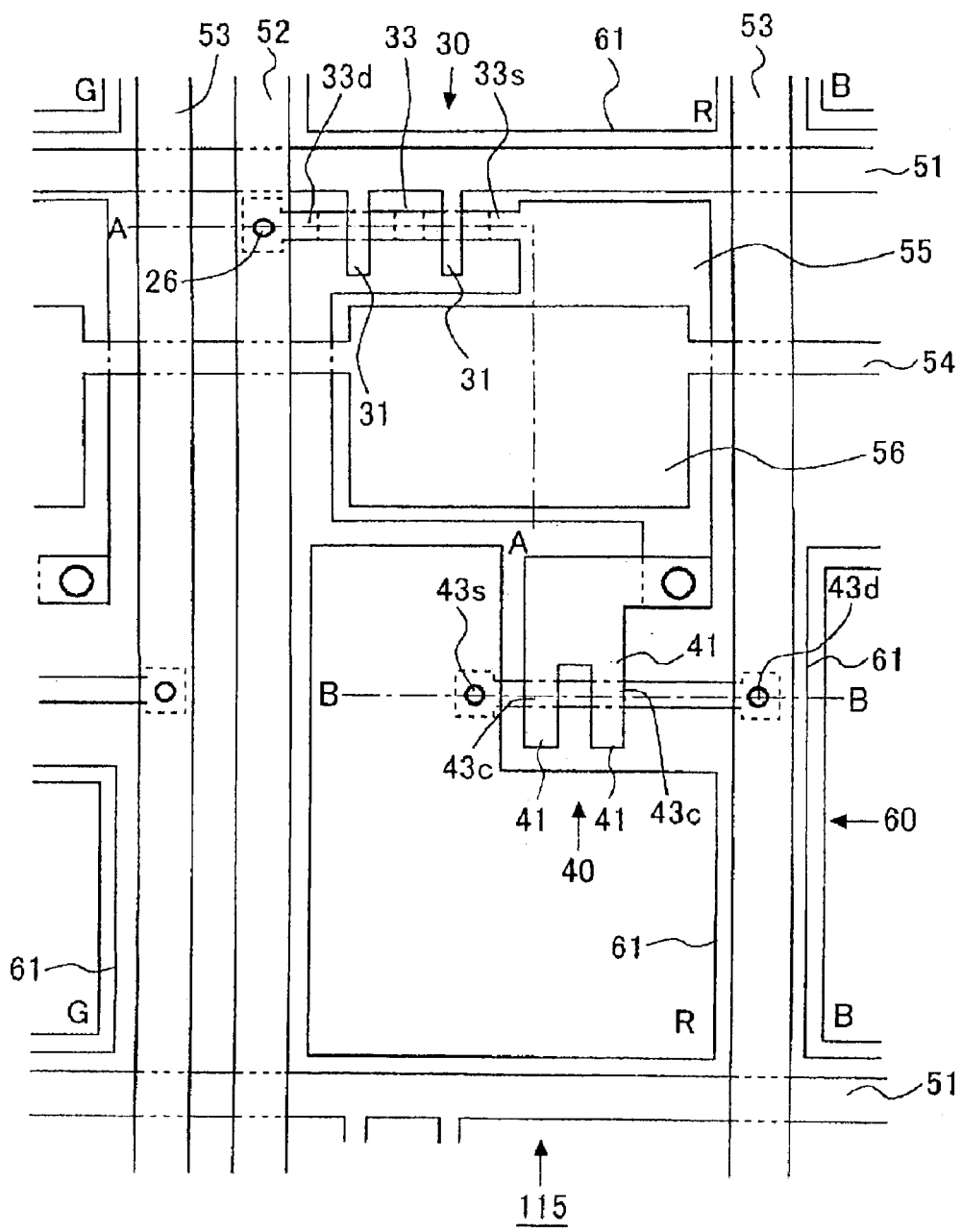
FIG. 8 is a plan view of a conventional EL display device.

Next, the surface of the shadow mask 1 is etched using the resist pattern 5 as a mask as seen from FIG. 6. Then, the resist pattern 5 is removed as shown in FIG. 7. It is possible to change the depth of concave and convex depending on the location of the shadow mask 1 by using both the sand blast processing and the etching processing using a mask. The depth of the concave and convex is larger at the locations away from the opening portion 2 in this example.

The contact area between the glass substrate 130 and the shadow mask 1 is smaller at the areas away from the opening portion 2, making the damage to the glass substrate 130 smaller, while the glass substrate 130 can be tightly placed to the shadow mask 1 near the opening portion 2 because of the larger contact area.

The sand blast processing and the etching processing are both employed in the this example. However, it is also possible to use either the sand blast processing or the etching processing alone. A stripe shaped surface structure, in place of the concave and convex structure, is also acceptable as the finished surface of the coarsening processing. In this case, the etching processing using a stripe shaped resist pattern is more suitable than the sand blast processing.

According to the evaporation method and the manufacturing method of this invention, the contact area of the evaporation mask with the substrate surface is small because the coarsening processing is performed to the surface of the evaporation mask facing the substrate, preventing the damage given to the substrate surface. The quality of the display device is especially improved.

What is claimed is:

1. An evaporation method comprising:
    providing an evaporation mask that has an opening and comprises a top-side coarsened surface;
    placing the evaporation mask on a bottom surface of a substrate so that the top-side coarsened surface of the evaporation mask contacts the bottom surface of the substrate; and
    depositing an evaporation material from an evaporation source on the bottom surface of the substrate through the opening of the evaporation mask.

2. The evaporation method of claim 1, wherein a height difference between a bottom of a concave structure of the top-side coarsened surface and a top of a convex structure of the top-side coarsened surface is between 1 $\mu$m and 10 $\mu$m.

3. The evaporation method of claim 1, wherein the evaporation mask further comprises a bottom-side coarsened surface, and the bottom-side coarsened surface faces the evaporation source during the depositing of the evaporation material.

4. The evaporation method of claim 3, wherein the top-side and bottom-side coarsened surfaces of the evaporation mask are formed by a sand blasting.

5. The evaporation method of claim 1, wherein the top-side and bottom-side coarsened surfaces of the evaporation mask are formed by an etching using an etching mask.

6. The evaporation method of claim 1, wherein the top-side coarsened surface of the evaporation mask is formed by a sand blasting.

7. The evaporation method of claim 1, wherein the top-side coarsened surface of the evaporation mask is formed by an etching using an etching mask.

8. A manufacturing method of a display device, comprising:
    providing an evaporation mask that has an opening and comprises a top-side coarsened surface, the evaporation mask being made of a magnetic material;
    placing an insulating substrate between a magnet and the evaporation mask so that the top-side coarsened surface of the evaporation mask faces a bottom surface of the insulating substrate;
    allowing the magnet to push the insulating substrate against the evaporation mask; and
    depositing an organic electroluminescent material from an evaporation source on the bottom surface of the insulating substrate through the opening of the evaporation mask.

9. The manufacturing method of a display device of claim 8, wherein a height difference between a bottom of a concave structure of the top-side coarsened surface and a top of a convex structure of the top-side coarsened surface is between 1 $\mu$m and 10 $\mu$m.

10. The manufacturing method of a display device of claim 8, wherein the evaporation mask further comprises a bottom-side coarsened surface, and the bottom-side coarsened surface faces the evaporation source during the depositing of the organic electroluminescent material.

11. The manufacturing method of a display device of claim 10, wherein the top-side and bottom-side coarsened surfaces of the evaporation mask are formed by a sand blasting.

12. The manufacturing method of a display device of claim 10, wherein the top-side and bottom-side coarsened surfaces of the evaporation mask are formed by an etching using an etching mask.

13. The manufacturing method of a display device of claim 8, wherein the top-side coarsened surface of the evaporation mask is formed by a sand blasting.

14. The manufacturing method of a display device of claim 8, wherein the top-side coarsened surface of the evaporation mask is formed by an etching using an etching mask.

* * * * *